United States Patent
Staudinger

(10) Patent No.: US 8,988,165 B2
(45) Date of Patent: Mar. 24, 2015

(54) DELAY LINE PHASE SHIFTER WITH SELECTABLE PHASE SHIFT

(75) Inventor: Joseph Staudinger, Gilbert, AZ (US)

(73) Assignee: Freescale Semiconductor, Inc, Austin, TX (US)

( * ) Notice: Subject to any disclaimer, the term of this patent is extended or adjusted under 35 U.S.C. 154(b) by 420 days.

(21) Appl. No.: 13/360,119

(22) Filed: Jan. 27, 2012

(65) Prior Publication Data

US 2013/0194017 A1   Aug. 1, 2013

(51) Int. Cl.
*H01P 1/18* (2006.01)
*H03H 7/20* (2006.01)
*H01P 1/15* (2006.01)

(52) U.S. Cl.
CPC ....................................... *H03H 7/20* (2013.01)
USPC .......................................... 333/139; 333/164

(58) Field of Classification Search
CPC ........... H03H 7/18; H03H 7/20; H03H 7/325; H01P 1/18; H01P 1/184
USPC .................... 333/139, 164, 103; 327/237, 355
See application file for complete search history.

(56) References Cited

U.S. PATENT DOCUMENTS

| | | | | |
|---|---|---|---|---|
| 7,239,218 B2* | 7/2007 | Nakamura | .................... | 333/139 |
| 7,928,817 B2* | 4/2011 | Atsumo | ........................ | 333/164 |
| 8,354,882 B2* | 1/2013 | Blednov | .................... | 330/124 R |
| 8,514,007 B1* | 8/2013 | Ahmed et al. | ................ | 327/355 |
| 2013/0314143 A1* | 11/2013 | Ahmed et al. | ................ | 327/360 |

OTHER PUBLICATIONS

A.A. Lane; GaAs MMIC Phase Shifters for Pahse Arrays;IEEE Colloquim on Solid State Components for Radar; pp. 3/1-3/5 1988.
Zawrotny, K; Cegielski, T; GAAS C-Band 4-Bit Phase Shifter MMIC; Microwaves, Radar and Wireless Communications 2008; Mikon 2008 17th international conference.

* cited by examiner

*Primary Examiner* — Dean Takaoka

(57) ABSTRACT

A phase shifter with selectable phase shift and comprises a switchable phase shifting element that includes a first and second signal path coupled between an input and an output and providing a, respective, first and second phase shift for a signal coupled through the respective signal paths; a switch circuit for selecting between the first and second signal paths where the first and second signal paths and the switch circuit are configured to equalize the insertion loss for the first and second signal path, the phase shifter further including control circuit for controlling the switch circuit.

22 Claims, 7 Drawing Sheets

DELAY LINE PHASE SHIFTER WITH SELECTABLE PHASE SHIFT

FIELD OF THE INVENTION

This invention relates in general to a delay line phase shifter and more particularly methods and apparatus for selectable phase shifting where phase shift and insertion loss are largely unrelated.

BACKGROUND OF THE INVENTION

Phase shifters are known. Various systems require a relatively closely controlled phase for signals provided by such systems. For example, various transceiver systems need to control relative phase between two or more signals fairly closely and phase shifters are one way to facilitate this phase control.

One concern with variable or selectable phase shifters is typically a change in insertion loss occurs with a change in phase shift. This is undesirable and leads to complications such as a variable attenuator to offset such changes in insertion loss. Even if an attenuator exists in the relevant system for other reasons, that attenuator will need to be more complicated with more steps if it serves multiple or additional purposes.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Figure 1:
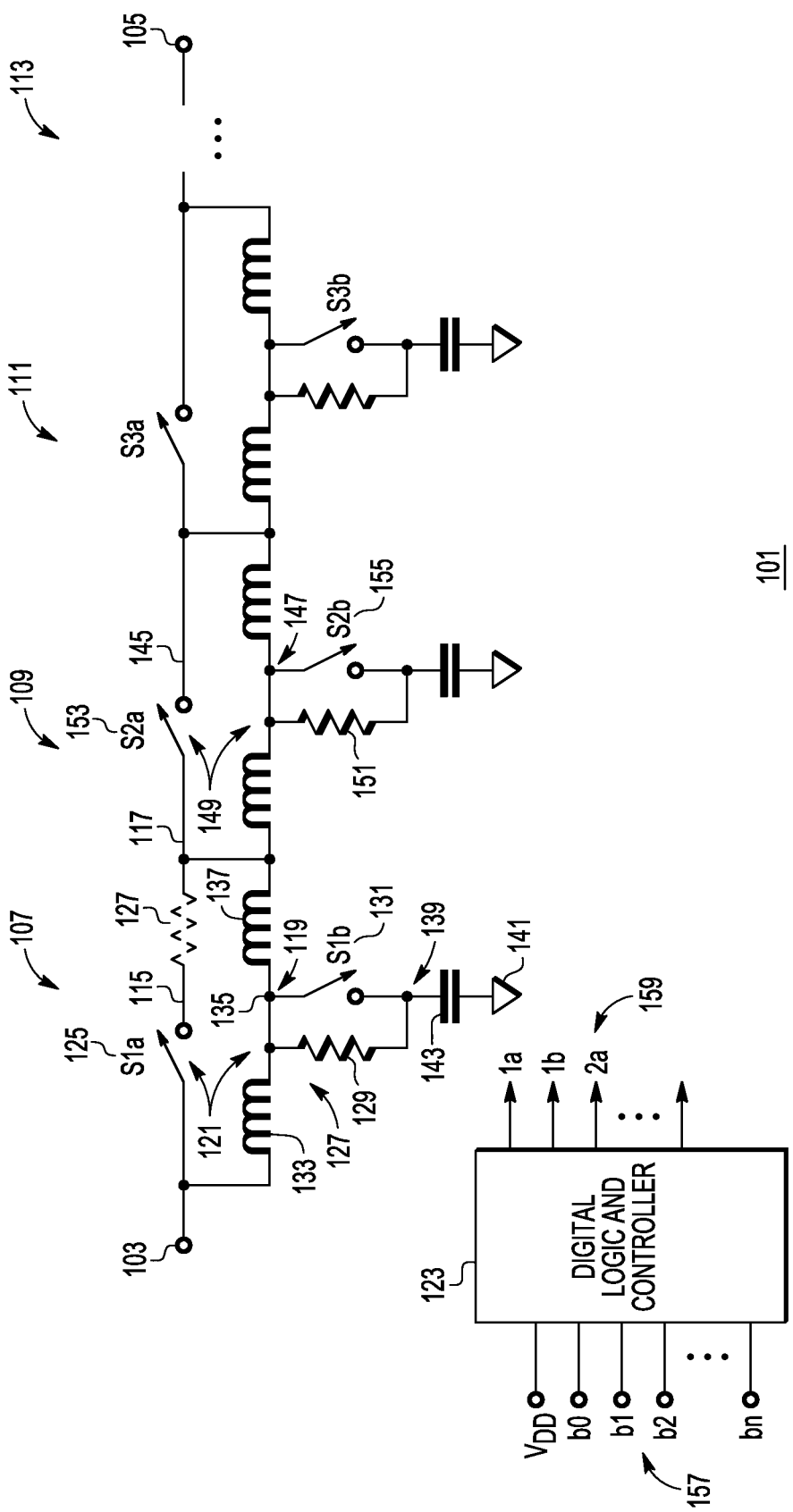
FIG. 1 depicts in a simplified and representative form, a high level diagram of a phase shifter with selectable phase shift in accordance with one or more embodiments.

In some embodiments, the present disclosure concerns phase shifters, e.g., delay line phase shifters, and more specifically techniques and apparatus for selectable phase shift that are arranged and constructed for equalizing insertion loss over various phase shifts. More particularly various inventive concepts and principles embodied in methods and apparatus, e.g. selectively applying a resistive loss, for equalizing insertion losses, etc. will be discussed and disclosed.

The phase shifters of particular interest may vary widely but include selectable or variable phase shifters used, e.g., in transceiver systems and the like. Such transceiver systems can be subject to various phase constraints and can experience phase variations due to various tolerances and build variables.

In systems, equipment and devices that employ phase shifters, the disclosed phase shifters with variable or selectable phase shifts and corresponding apparatus and methods can be particularly advantageously utilized, provided they are practiced in accordance with the inventive concepts and principles as taught herein.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions.

Much of the inventive functionality and many of the inventive principles are best implemented, in full or in part with discrete elements or with or in integrated circuits (ICs) and micro-strip lines or similar structures including possibly application specific structures and ICs or ICs with integrated processing controlled by embedded software or firmware. It is expected that one of ordinary skill, notwithstanding possibly significant effort and many design choices motivated by, for example, available time, current technology, and economic considerations, when guided by the concepts and principles disclosed herein will be readily capable of generating such structures and ICs and any software instructions and programs with minimal experimentation. Therefore, in the interest of brevity and minimization of any risk of obscuring the principles and concepts according to the present invention, further discussion of such ICs and structures and software, if any, will be limited to the essentials with respect to the principles and concepts of the various embodiments.

Referring to FIG. 1, a simplified and representative high level diagram of a phase shifter or delay line phase shifter with selectable phase shift in accordance with one or more embodiments will be briefly discussed and described. In FIG. 1, a phase shifter 101 or delay line phase shifter with selectable or variable phase shift is shown in a representative manner. The phase shifter 101 has an input 103 or signal input for input signals, e.g., radio frequency (RF) signals and an output 105 or signal output for phase shifted versions of the input signal, e.g., phase shifted versions of the RF signals. Between the input 103 and output 105 are one or more switchable phase shifting elements or circuits, including specifically phase shifting elements 107, 109, 111, and possibly additional phase shifting elements or circuits 113 serially coupled as shown.

Generally speaking in many embodiments and as will be further discussed and described below, the switches shown are provided with a pair of single throw switches a, b for each phase shifting element 107, 109, 111, 113. Each of the phase shifting elements can be designed, arranged and configured to provide some predetermined amount of phase shift. If a practitioner needs to cover a certain range of phase shift and needs a certain resolution for the phase shift it can be advantageous to design the first or one of the phase shifting elements to provide a choice between nominally zero or a minimal phase shift and the smallest phase shift step one needs (i.e., the resolution) with the next or another phase shifting element configured to provide minimal or 2× the smallest step needed.

Thus with two phase shifting elements you can provide a near zero, 1×, 2×, and 3× small step in phase shift by activating different combinations of the a, b switches. Adding another phase shifting element with a 4× shift, allows 8 states with corresponding 0 to 7× the small step and so on. The number of phase shifting elements will be determined by the required resolution (step size) and the phase range needed to be covered (number of steps). For example if you want to cover 49 degrees with a resolution of 7 degrees then 8 states, including 0 will be required and this can be accomplished with 3 phase shifting elements etc. etc.

In more detail, switchable phase shifting element or circuit 107 (and the other similar phase shifting elements) further comprises a first signal path 115 coupled between an input 103 and an output 117. The first signal path, when activated, will be providing a first phase shift for a signal coupled through the first signal path, where this phase shift in many embodiments will be near zero or a minimal phase shift. Further included is a second signal path 119 coupled between the input 103 and the output 117 and configured for providing a second phase shift for a signal coupled through the second signal path. Further, the switchable phase shifting element includes a switch circuit 121 for selecting between the first signal path and the second signal path. The first signal path and the second signal path and the switch circuit are configured to equalize first insertion loss for the first signal path and second insertion loss for the second signal path. The switch circuit 121 is controlled by a control circuit 123, which can be a processor or other controller and which can be or be viewed as a portion of the phase shifter with selectable phase shift.

Figure 2:
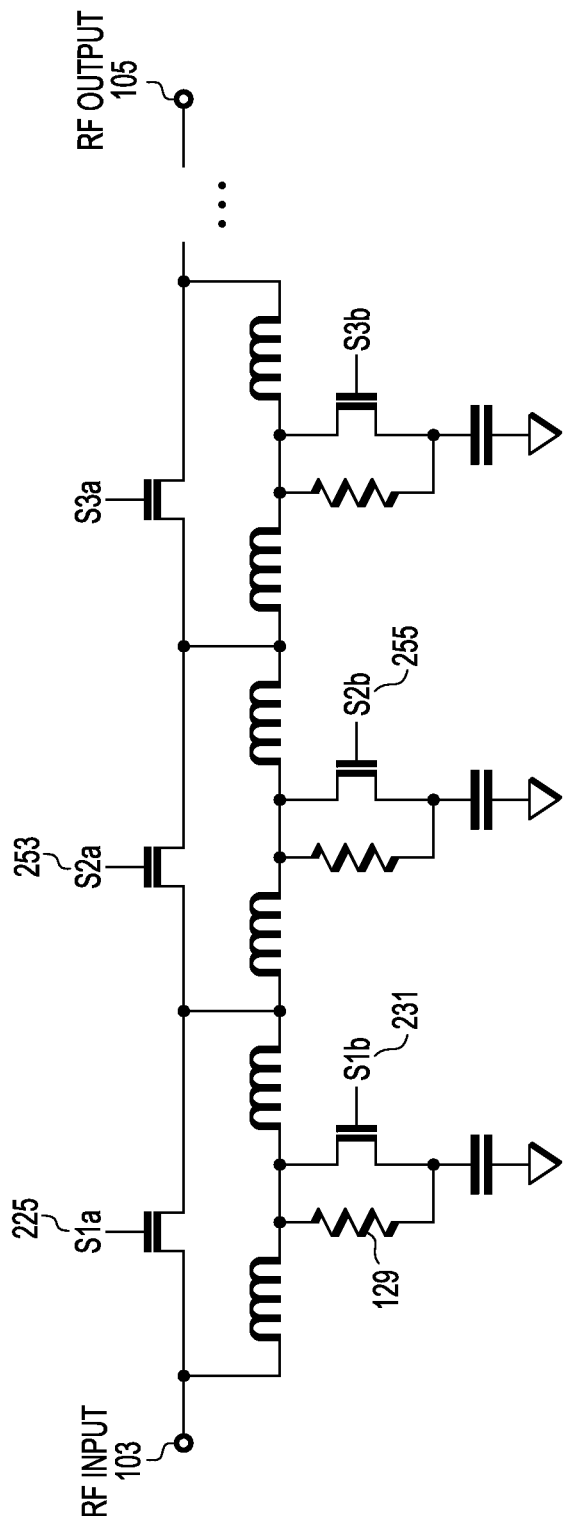
FIG. 2 in a representative form, shows a further phase shifter with selectable phase in accordance with one or more embodiments.

The switch circuit in some embodiments further comprises a switch S1a 125 disposed in series with the first signal path 115 and in some embodiments, e.g., as shown in FIG. 2 this switch can be an integrated circuit switch 225. This integrated circuit switch 225 can be or can be fashioned to include a pseudo morphic High Electron Mobility Transistor (pHEMT). In some embodiments, the first signal path further comprises a resistive loss circuit 127 and the switch circuit 121 further comprises a switch 125, e.g., an integrated circuit switch 225 disposed in series with the first signal path. In these embodiments or other embodiments, when the switch 125 or integrated circuit switch 225 is activated (closed or ON) thus selecting the first signal path 115, the resistive loss circuit 127 or resistor is configured or value chosen to equalize the first insertion loss and the second insertion loss expected when the second signal path is selected (i.e., switch 125 is open).

As noted briefly above various embodiments of the phase shifter 100 or delay line phase shifter or more specifically the switchable phase shifting element 107 (or similar elements) (hereafter phase shifter) have the first signal path 115 configured for minimal phase shifting or near zero phase shifting and the second signal path 119 is configured to provide the second phase shift to a signal coupled through the second signal path from the input 103 to the output 117. The phase shifter in various embodiments further includes a reactive circuit 127 disposed in the second signal path and configured to provide the second phase shift and a resistive loss circuit 129, wherein the switch circuit 121 further comprises a switch S1b 131 which in some embodiments (see FIG. 2) can be an integrated circuit switch 231. The switch S1b 131 is configured and arranged to by pass (short circuit as switch is activated or turned on) the resistive loss circuit 129 when the second signal path is selected.

Various embodiments of the reactive circuit 127 further comprise a first reactance 133 series coupled at a common node 135 to a second reactance 137 and a shunt circuit 139 coupled from the common node 135 to a reference 141 or reference node, e.g., a ground potential. The shunt circuit 139 in varying embodiments further comprise a third reactance 143 in series with the resistive loss circuit 129 where the switch 131 or integrated circuit switch 231 is in parallel with the resistive loss circuit 129. The phase shifter 101 or more specifically reactive circuit 127 can be configured where the first reactance 133 and the second reactance 137 are each an inductive reactance (as shown) including at least one of a lumped inductor (as shown) or a high impedance transmission line (not specifically shown but known), the third reactance 143 is a capacitive reactance (as shown) including a metal insulator metal capacitor (not specifically shown but generally known) and the switch 131 or in some embodiments, the integrated circuit switch 231 is a pHEMT.

Thus the phase shifter or more specifically switchable phase shifting element can be configured so that the switch circuit includes a first integrated circuit switch 225 disposed in series with the first signal path 115 and configured to select between the first signal path and the second signal path and a second integrated circuit switch 231 associated with the second signal path and configured to equalize the first insertion loss and the second insertion loss, e.g., by switching in a resistive loss circuit 129. As noted above the reactive circuit can be a first and second reactance series coupled at a common node, with the first and second reactance disposed in the second signal path, and further comprising a shunt circuit coupled from the common node to a reference node, wherein the shunt circuit includes a reactance series coupled to a parallel combination of a second integrated circuit switch and a resistive loss circuit.

When the first switch 125 or first integrated circuit switch 225 is closed, ON, or activated it selects the first signal path (provides a short circuit around the second signal path) and when the first switch 125, 225 is open, OFF, or inactivated it deselects (opens) the first signal path and signal is routed via the second signal path 119 and reactive phase shifting or changing circuit 127. When the first switch is closed the second switch will be open thereby adding the resistive loss circuit 129 to the reactive circuit 127. This additional loss when the first signal path is chosen can be selected, i.e., resistor value chosen, by experimental processes to equalize the insertion loss when the first signal path is selected with the insertion loss when the second signal path is selected, thereby removing any relationship between phase shift and insertion loss. Typically the resistive loss circuit or resistor will be several orders of magnitude larger than the ON resistance of an integrated circuit switch.

Thus FIG. 1 and FIG. 2 each illustrate varying embodiments of a phase shifter or delay line phase shifter with selectable phase shift. In overview the phase shifter comprises: a first switchable phase shifting element 107 including, in parallel, in some embodiments a first signal path 115 with a minimal phase shift and a second signal path 119 with a predetermined first phase shift and a first switch circuit 121 for selecting between the first and second signal path, the first signal path and the second signal path and the first switch circuit 121 configured to equalize first insertion loss for the first signal path and second insertion loss for the second signal path by switching in (open switch 131) a first resistive loss circuit 129 when the first signal path is selected; and a second switchable phase shifting element 109 coupled in series with the first switchable phase shifting element (as depicted output 117 from element 107 is the input to element 109) The second switchable phase shifting element (analogous to the first) includes, in parallel, a third signal path 145 with in some embodiments a minimal phase shift and a fourth signal path 147 with a predetermined second phase shift and a second switch circuit 149 for selecting between the third and fourth signal path. The third signal path and the fourth signal path and the second switch circuit are configured to equalize third insertion loss for the third signal path and fourth insertion loss for the fourth signal path by switching in (open switch 155) a second resistive loss circuit 151 when the third signal path is selected. In some embodiments the first and third phase shifts are minimal and the second and fourth phase shifts are different predetermined phase shifts, e.g., the fourth is 2 times the second, etc.

In still further embodiments a third switchable phase shifting element 111 is coupled in series with the second phase shifting element and includes, in parallel, a fifth signal path with a fifth phase shift and a sixth signal path with a sixth phase shift and a third switch circuit for selecting between the fifth and sixth signal path, the fifth signal path and the sixth signal path and the third switch circuit configured to equalize fifth insertion loss for the fifth signal path and sixth insertion loss for the sixth signal path by switching in a third resistive loss circuit when the fifth signal path is selected. In some of these embodiments the first, third, and fifth phase shifts are minimal and the second, fourth, and sixth phase shifts are different from each other, e.g., the fourth is 2× the second and the sixth is 2× the fourth. Further included is the control circuit 123 for controlling the first switch circuit and the second switch circuit.

As noted above, the first switch circuit 121 can comprise a first switch 125 or integrated switch 225 in series with the first signal path and a second switch 131 or integrated circuit switch 231 for switching in the first resistive loss circuit 129, wherein the first and second switch or integrated circuit switch are alternatively activated (when switch 125 is ON or CLOSED, switch 131 is OFF or OPEN). Similarly the second switch circuit 149 can comprise a third switch S2a 153 or integrated circuit switch 253 in series with the third signal path and a fourth switch S2b 155 or integrated circuit switch 255 for the switching in the second resistive loss circuit 151, wherein the third and fourth switch or integrated circuit switch are alternatively activated (when one closed other open). In some embodiments, the first (and second) resistive loss circuit is a resistor in parallel with the second (and fourth) integrated circuit switch and the first (and second) resistive loss circuit is switched in by opening the second (and fourth) integrated circuit switch, thereby equalizing the first and second (and third and forth) insertion loss.

The control circuit is arranged to control first, second, third and fourth switches and any others. As suggested above in some embodiments the control circuit is configured to select at least one state from available states of minimal phase shift, a first phase shift, a second phase shift, and a first plus second phase shift by activating one or more of the first, thus second, and third, thus fourth, integrated circuit switches. To select the states in order (near zero phase shift through first plus second phase shift), switches 125, 153 are ON for near zero, switches 131, 153 are ON for a first shift, switches 125, 155 are ON for a second phase shift, and switches 131, 155 are ON for a first plus second phase shift. In the above, it is understood that undesignated or unspecified switches are OFF. As suggested above, each time another switchable phase shifting element or circuit is added the number of possible states can double and the range of phase shift for a given step size can therefore double or alternatively for a given range the resolution can double, i.e., step size can be cut in half.

The control circuit in addition to possibly selecting timing for activating switches and decoding inputs 157 can, for many embodiments, by viewed as a register or buffer for storing switch state (ON or OFF) information with outputs 159 with one output coupled to each of the switches. The control circuit is programmed or loaded via inputs 159. These inputs may simply specify a state for the phase shifter which is then decoded by the control circuit into switch states or the inputs can be the state for each switch or specify how much phase shift is desired with the control circuit then determining an appropriate state. The inputs can be sent to the control circuit via a serial peripheral interface (SPI). This is a generally known serial interface which includes a clock, data in and out signal, and a chip select signal.

Referring to FIG. 2, a further phase shifter or delay line phase shifter with selectable phase in accordance with one or more embodiments will be briefly discussed and described. FIG. 2 illustrates a phase shifter using integrated circuit switches. FIG. 2 has been discussed in part above. FIG. 2 can be similar in structure and function or operation to the phase shifter in FIG. 1. In FIG. 2 as in FIG. 1 when a switch is closed thereby routing signals via the near zero phase shift path, a loss is added to the other path by opening a second switch. This loss is chosen so that the insertion loss when the signal is routed via the direct path is nearly equal to the loss when the signal is routed via the phase shifting path. Equalized or nearly equal means the respective insertion losses are within 1 dB of each other.

Figure 3:
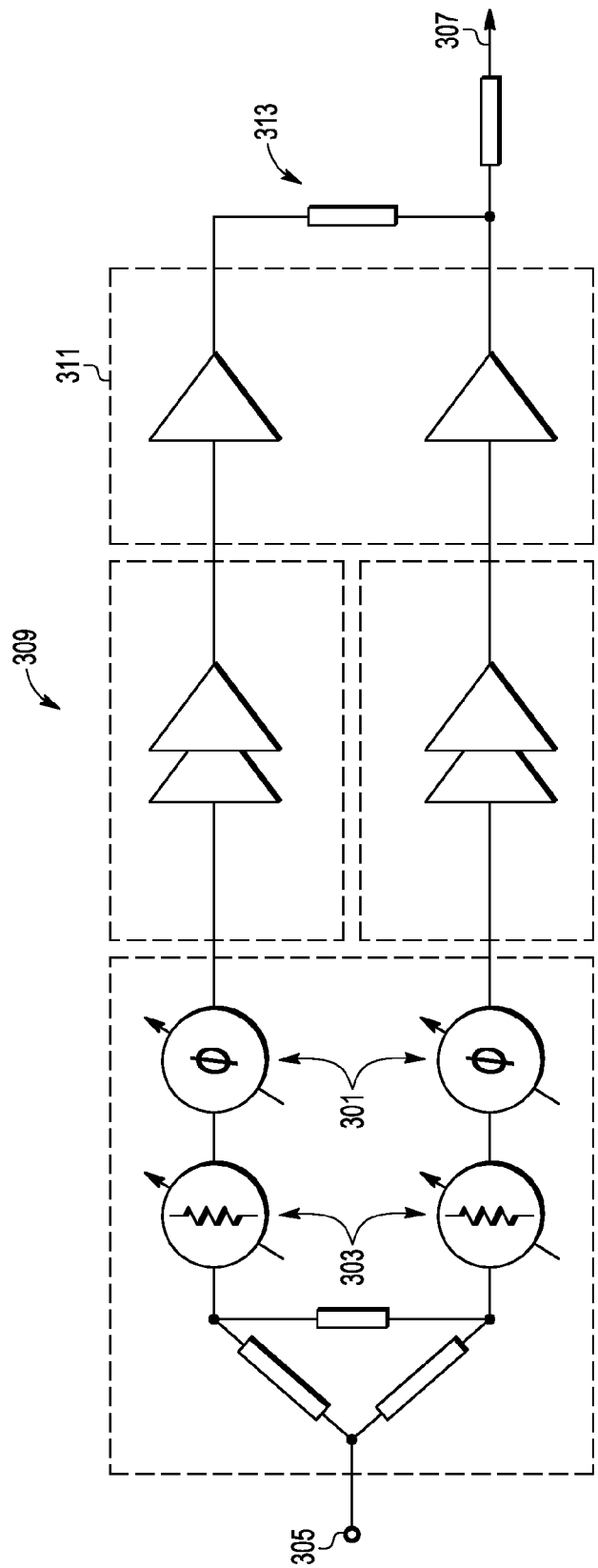
FIG. 3 depicts a representative diagram of a system application of the delay line phase shifter of FIG. 1 or 2.

Referring to FIG. 3, a representative diagram of a system application of the delay line phase shifter of FIG. 1 or 2 will be discussed and described. FIG. 3 shows a transmitter line up, such as a Doherty Amplifier that can be used in a transmitter. The phase shifters 301 with selectable phase shift are used in each of two signal paths. Further included in each path is a variable or adjustable attenuator 303. The FIG. 3 system is one embodiment in accordance with the subject matter of co-pending patent application titled AN ADJUSTABLE POWER SPLITTER AND CORRESPONDING METHODS & APPARATUS by Ahmed et al with a filing date that is equal to the filing date of the present application and bearing Ser. No. 13/360,473 (now issued as U.S. Pat. No. 8,514,007), which application is hereby incorporated herein by reference.

Generally a signal is applied at input 305 and after amplification is provided at output 307. The signal at the input is split or divided and then each divided signal is adjusted in amplitude by the attenuators 303 and in phase by the phase shifters 301, and then input to a first amplification stage 309, after which the amplified signals are applied to a dual path final amplifier stage 311. One of theses paths is the general purpose amplifier which operates all of the time, while the second stage is often referred to as a peaking stage and operates primarily on signals that have large peaks. The outputs from the two amplifier paths are then combined by network 313, which makes use of a ¼ wave transmission line and impedance transformation properties thereof to properly combine the amplifier outputs. For this amplifier to operate effectively, both amplitude and phase must be carefully selected or aligned. Having the phase alignment or shifters can provide for, e.g., significantly higher production yields and operational efficiencies.

Figure 4:
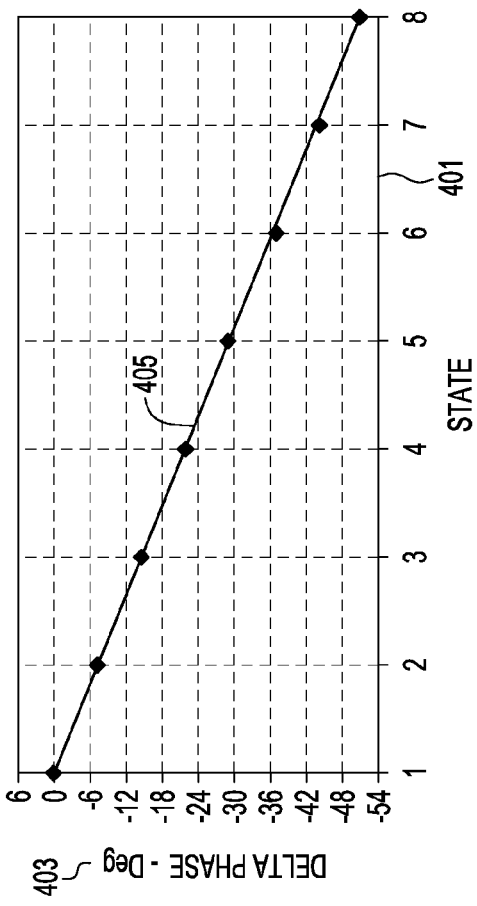
FIG. 4 through FIG. 7 show simulation results from models for delay line phase shifters in accordance with one or more embodiments.
Figure 5:
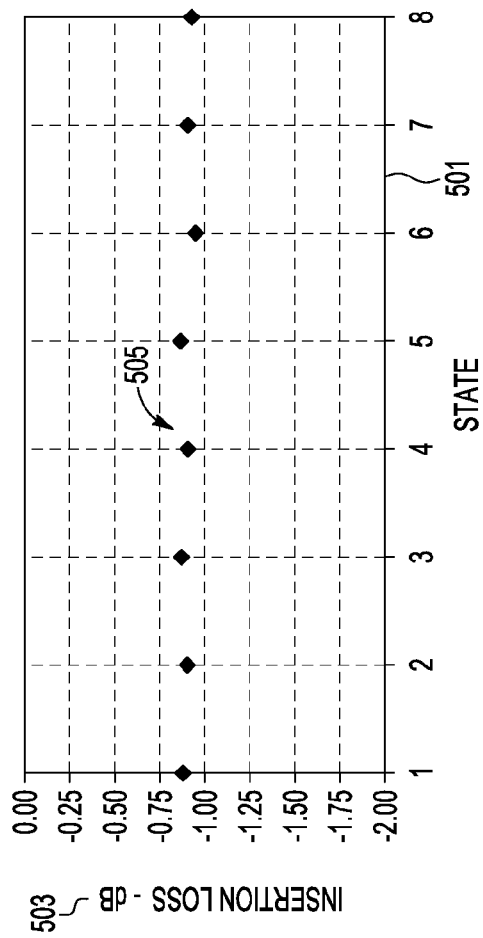

Referring to FIG. 4 through FIG. 7, various simulation results from models for delay line phase shifters in accordance with one or more embodiments will be briefly discussed and described. FIG. 4 and FIG. 5 are results from one embodiment with FIG. 4 showing phase shift and FIG. 5 showing insertion loss, respectively, as a function of state. In FIG. 4 the horizontal axis 401 shows the phase shifter state from 1 to 8 and the vertical axis 403 shows the corresponding phase shift. A line 405 has been drawn to connect the 8 phase shift points. It can be observed that a total range exceeding 50 degrees has been covered in 7 steps giving a 7+ degrees per step resolution. In FIG. 5 the horizontal axis 501 again shows state, while the vertical axis 503 shows S21 or insertion loss in dB. It can be observed 505 that the insertion loss over 8 states or 7 steps varies less than 0.1 dB.

Figure 6:
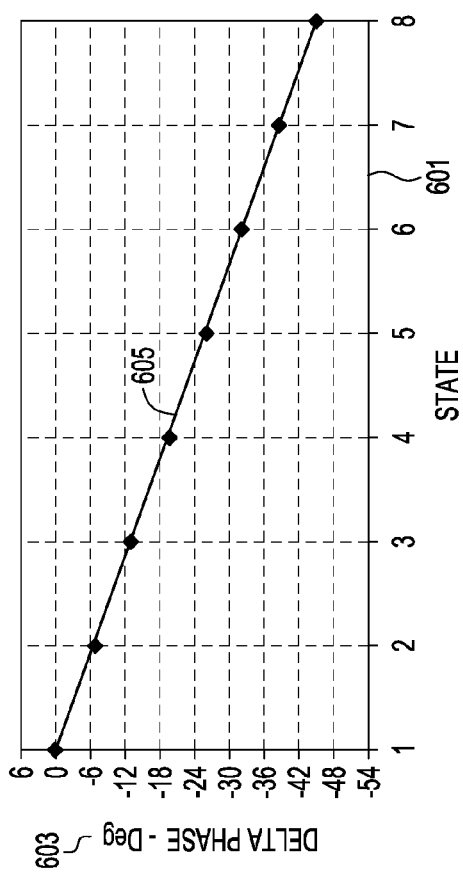
Figure 7:
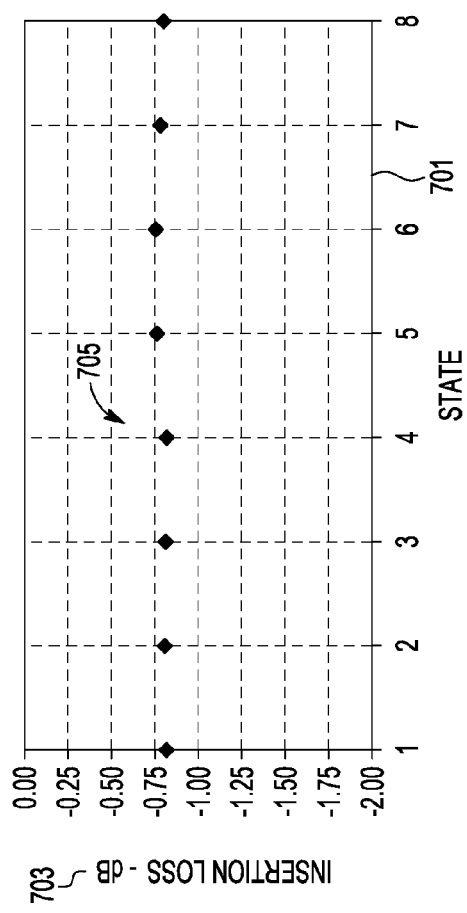

FIG. 6 and FIG. 7 are results from another embodiment with FIG. 6 showing phase shift and FIG. 7 showing insertion loss as a function of state. In FIG. 6 the horizontal axis 601 shows the phase shifter state from 1 to 8 and the vertical axis 603 shows the corresponding phase shift. A line 605 has been drawn to connect the 8 phase shift points. It can be observed that a total range of approximately 45 degrees has been covered in 7 steps giving a just less than 6.5 degrees per step resolution. In FIG. 7 the horizontal axis 701 again shows state, while the vertical axis 703 shows S21 or insertion loss in dB. It can be observed 705 that the insertion loss over 8 states or 7 steps varies less than 0.1 dB.

Figure 8:
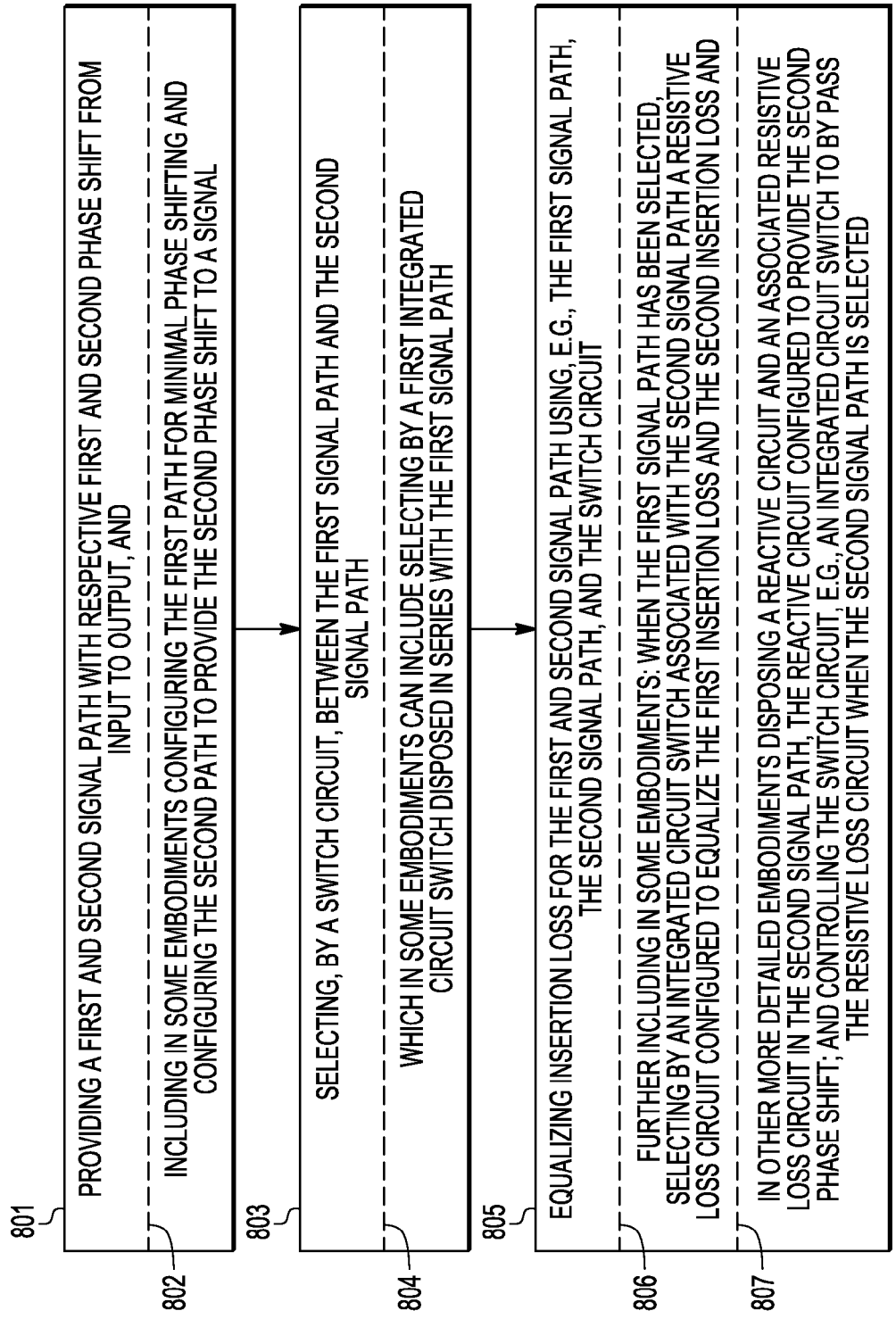
FIG. 8-9 show flow charts for methods for selecting a phase shift that may be used in conjunction with the FIG. 1 or FIG. 2 delay line phase shifter systems in accordance with one or more embodiments.

Referring to FIG. 8, a flow chart for a method for selecting a phase shift that may be used in conjunction with the FIG. 1, 2 phase shifter systems in accordance with one or more embodiments will be briefly discussed and described. It will be appreciated that this method uses many of the inventive concepts and principles discussed in detail above and thus this description will be somewhat in the nature of a summary with various details generally available in the earlier descriptions. This method can be implemented in one or more of the structures or apparatus described earlier or other similarly configured and arranged structures. This method can be performed as needed and as many times as needed.

As noted, FIG. 8 illustrates various methods in a phase shifter for selecting a phase shift and starts by providing 801 a phase shifting element or circuit including a first and second signal path from an input to an output, the first and second signal path having a corresponding first and second phase shift for a signal coupled through the respective first and second signal path. In some embodiments the providing includes configuring 802 the first signal path for minimal phase shifting and configuring the second signal path to provide the second phase shift to a signal coupled through the second signal path. It will be appreciated that a plurality of phase shifting elements serial coupled can be provided with each performing similarly to provide greater range for selecting a phase shift.

The method moves to selecting 803, by a switch circuit, between the first signal path and the second signal path. In varying embodiments the selecting by the switch circuit can include selecting 804, by a first integrated circuit switch that is disposed in series with the first signal path, between the first signal path and the second signal path.

Next the method includes equalizing 805 first insertion loss for the first signal path and second insertion loss for the second signal path. This is done using the configuration and arrangement of the first signal path, the second signal path, and the switch circuit. In some embodiments this includes selecting 806 by a second integrated circuit switch 231 associated with the second signal path a resistive loss circuit 129 configured to equalize the first insertion loss and the second insertion loss whenever the first signal path has been selected.

In further embodiments, the equalizing can include: disposing 807 a reactive circuit and an associated resistive loss circuit in the second signal path, where the reactive circuit is configured to provide the second phase shift; and controlling the switch circuit or an integrated circuit switch to by pass the resistive loss circuit when the second signal path is selected. As noted previously, disposing a reactive circuit can comprise disposing a first reactance and a second reactance that are series coupled at a common node and disposing a shunt circuit coupled from the common node to a reference or reference node. The shunt circuit can comprise a third reactance in series with the resistive loss circuit where the integrated circuit switch is in parallel with the resistive loss circuit. More specifically in some embodiments, the first reactance and the second reactance are each an inductive reactance including, e.g., at least one of a lumped inductor and a high impedance transmission line, the third reactance can be a capacitive reactance including, e.g., a metal insulator metal capacitor and the integrated circuit switch can be, e.g., a pseudo morphic High Electron Mobility Transistor (pHEMT).

Figure 9:
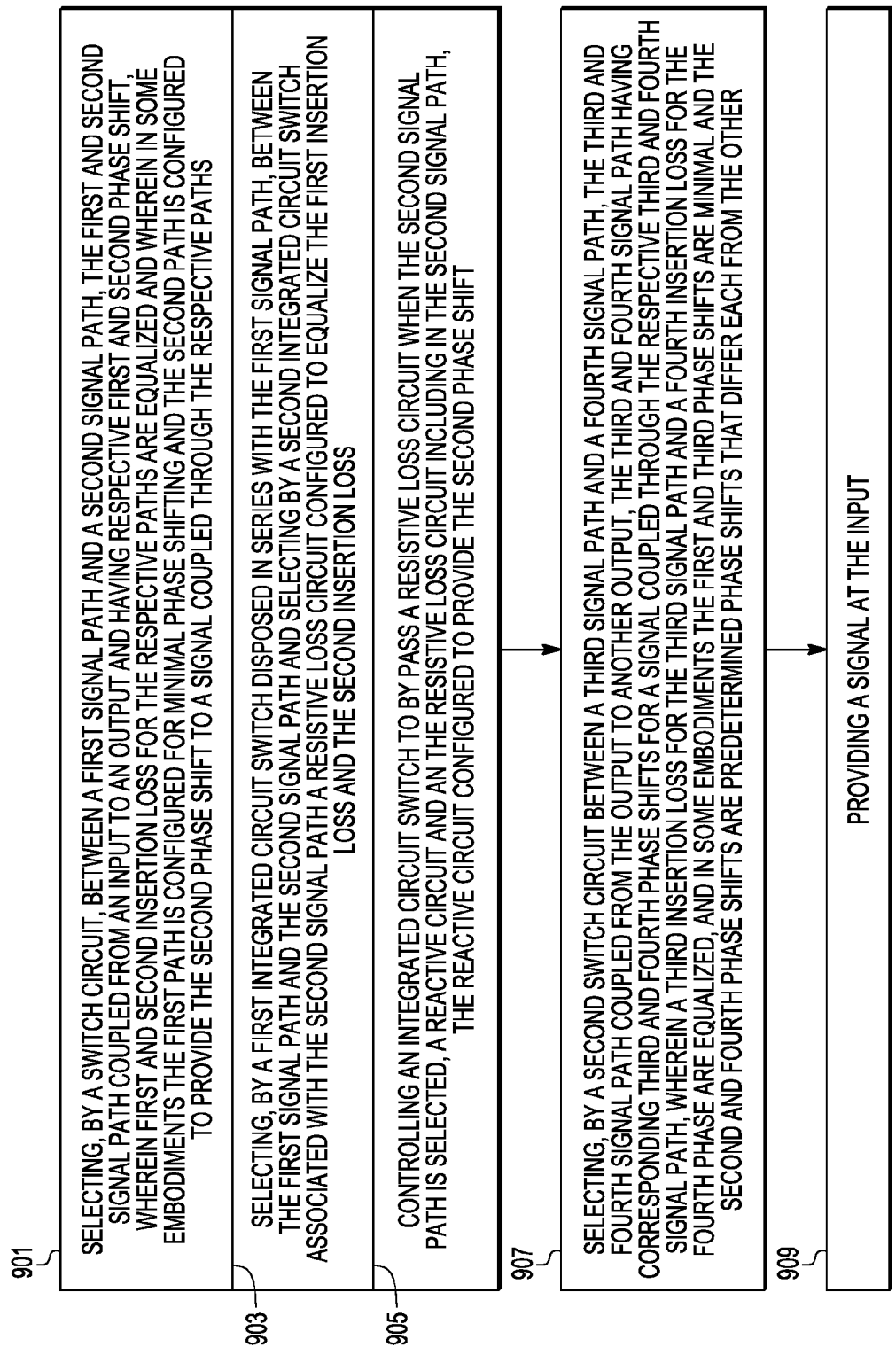

Referring to FIG. 9, another flow chart for a method for selecting a phase shift that may be used in conjunction with the FIG. 1, 2 phase shifter systems in accordance with one or more embodiments will be briefly discussed and described. It will be appreciated that this method uses many of the inventive concepts and principles and processes discussed in detail above and thus this description will be somewhat in the nature of a summary with various details generally available in the earlier descriptions. This method can be implemented in one or more of the structures or apparatus described earlier or other similarly configured and arranged structures. This method can be performed as needed and as many times as needed.

This method begins at selecting 901, by a switch circuit, between a first signal path and a second signal path; wherein the first and the second signal path are coupled from an input to an output, the first and second signal path having a corresponding first and second phase shift for a signal coupled through the respective first and second signal path; wherein a first insertion loss for the first signal path and a second insertion loss for the second signal path are equalized. In some embodiments, the first signal path is configured for minimal phase shifting and the second signal path is configured to provide the second phase shift to a signal coupled through the second signal path.

In some instances the selecting 901 by the switch circuit can include selecting, 903 by a first integrated circuit switch disposed in series with the first signal path, between the first signal path and the second signal path and selecting by a second integrated circuit switch associated with the second signal path a resistive loss circuit configured to equalize the first insertion loss and the second insertion loss. Thus in some embodiments, the switch circuit further includes an integrated circuit switch and the selecting further comprises controlling 905 the integrated circuit switch to by pass a resistive loss circuit when the second signal path is selected, where the second signal path includes a reactive circuit and the resistive loss circuit and the reactive circuit is configured to provide the second phase shift. The reactive circuit can be arranged and constructed as discussed above.

In further embodiments, the method can include, as shown, second selecting 907, by a second switch circuit between a third signal path and a fourth signal path wherein the third and fourth signal path are coupled from the output to another output, the third and fourth signal path having corresponding third and fourth phase shifts for a signal coupled through the respective third and fourth signal path, wherein a third insertion loss for the third signal path and a fourth insertion loss for the fourth path are equalized. In still further embodiments, the first and third phase shifts can be minimal or zero and the second and fourth phase shifts are predetermined phase shifts that differ each from the other. Their can be third and more selecting steps as needed. Once the selecting processes have occurred, the method shows providing 909 a signal at the input. It will be appreciated that the selecting steps can be repeated after a signal has been applied, etc.

It will be appreciated that the above described functions and structures may be implemented in part or entirely in one or more integrated circuits or a metal gallium arsenide substrate with integrated circuits, micro strip lines and possibly discrete lumped components, where the actual implementation will likely depend on operating frequencies.

The processes, apparatus, and systems, discussed above, and the inventive principles thereof are intended to and can alleviate various problems with prior art systems including excess insertion loss or insertion loss imbalances between signal paths, extra and more complex switches (use single pole single throw switches rather than single pole double throw switches in some prior art systems) (eliminates one switch per switchable phase shifter element or sub circuit.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A phase shifter with selectable phase shift comprising:
a switchable phase shifting element, the switchable phase shifting element further comprising;
a first signal path coupled between an input and an output and providing a first phase shift for a signal coupled through the first signal path;
a second signal path coupled between the input and the output and providing a second phase shift, differing from the first phase shift, for a signal coupled through the second signal path,
a switch circuit for selecting between the first signal path and the second signal path, the first signal path and the second signal path and the switch circuit configured to equalize first insertion loss for the first signal path and second insertion loss for the second signal path,
wherein the switchable phase shifting element further includes a reactive circuit disposed in the second signal path and configured to provide the second phase shift and a resistive loss circuit, wherein the switch circuit further comprises a switch arranged to selectively by pass the resistive loss circuit, thereby equalizing the first and second insertion loss; and
a control circuit for controlling the switch circuit.

2. The phase shifter of claim 1 wherein the switch circuit further comprises an integrated circuit switch disposed in series with the first signal path.

3. The phase shifter of claim 1 wherein the first signal path further comprises the resistive loss circuit and where the switch circuit further comprises an integrated circuit switch disposed in series with the first signal path, such that when the integrated circuit switch is activated thus selecting the first signal path, the resistive loss circuit is configured to equalize the first insertion loss and the second insertion loss expected when the second signal path is selected.

4. The phase shifter of claim 1 wherein the first signal path is configured for minimal phase shifting and wherein the second signal path is configured to provide the second phase shift to a signal coupled through the second signal path.

5. The phase shifter of claim 4, wherein the switch circuit further comprises an integrated circuit switch arranged to by pass the resistive loss circuit when the second signal path is selected.

6. The phase shifter of claim 5 wherein the reactive circuit further comprises a first reactance series coupled at a common node to a second reactance and a shunt circuit coupled from the common node to a reference node, the shunt circuit further comprising a third reactance in series with the resistive loss circuit where the integrated circuit switch is in parallel with the resistive loss circuit.

7. The phase shifter of claim 6 wherein the first reactance and the second reactance are each an inductive reactance including at least one of a lumped inductor and a high impedance transmission line, the third reactance is a capacitive reactance including a metal insulator metal capacitor and the integrated circuit switch is a pseudo morphic high electron mobility transistor controlled by the control circuit.

8. The phase shifter of claim 1 wherein the first insertion loss for the first signal path and the second insertion loss for the second signal path are within 0.3 dB of each other.

9. The phase shifter of claim 1 further comprising:
a second switchable phase shifting element coupled in series with the switchable phase shifting element and including, in parallel, a third signal path with a third phase shift and a fourth signal path with a fourth phase shift and a second switch circuit for selecting between the third and fourth signal path, the third signal path and the fourth signal path and the second switch circuit configured to equalize third insertion loss for the third signal path and fourth insertion loss for the fourth signal path by switching in a second resistive loss circuit when the third signal path is selected.

10. The phase shifter of claim 9 wherein first and third phase shifts are minimal and the second and fourth phase shifts are different predetermined phase shifts.

11. The phase shifter of claim 9 further comprising:
a third switchable phase shifting element coupled in series with the second phase shifting element and including, in parallel, a fifth signal path with a fifth phase shift and a sixth signal path with a sixth phase shift and a third switch circuit for selecting between the fifth and sixth signal path, the fifth signal path and the sixth signal path and the third switch circuit configured to equalize fifth insertion loss for the fifth signal path and sixth insertion loss for the sixth signal path by switching in a third resistive loss circuit when the fifth signal path is selected;
wherein the second, fourth, and sixth phase shifts are different from each other.

12. The phase shifter of claim 9 wherein the first switch circuit comprises a first integrated switch in series with the first signal path and a second integrated circuit switch for switching in a first resistive loss circuit, wherein the first and second integrated circuit switch are alternatively activated and wherein the second switch circuit comprises a third integrated circuit switch in series with the third signal path and a fourth integrated circuit switch for the switching in the second resistive loss circuit, wherein the third and fourth integrated circuit switch are alternatively activated, and wherein the control circuit is configured to select at least one of minimal phase shift, a first phase shift, a second phase shift and a first plus second phase shift by activating one or more of the first, thus second, and third, thus fourth, integrated circuit switches.

13. The phase shifter of claim 1 used in a Doherty amplifier wherein the selectable phase shift is used to adjust the phase in a signal path at the input to the Doherty amplifier.

14. A phase shifter with selectable phase shift comprising:
a switchable phase shifting element, the switchable phase shifting element further comprising:
   a first signal path coupled between an input and an output and providing a first phase shift for a signal coupled through the first signal path;
   a second signal path coupled between the input and the output and providing a second phase shift, differing from the first phase shift, for a signal coupled through the second signal path,
   a switch circuit for selecting between the first signal path and the second signal path, the first signal path and the second signal path and the switch circuit configured to equalize first insertion loss for the first signal path and second insertion loss for the second signal path,
   wherein the switch circuit includes a first integrated circuit switch disposed in series with the first signal path and configured to select between the first signal path and the second signal path and a second integrated circuit switch associated with the second signal path and configured to equalize the first insertion loss and the second insertion loss; and
a control circuit for controlling the switch circuit.

15. The phase shifter of claim 14 further comprising a first and second reactance series coupled at a common node, the first and second reactance disposed in the second signal path, and further comprising a shunt circuit coupled from the common node to a reference node, wherein the shunt circuit includes a reactance series coupled to a parallel combination of a second integrated circuit switch and a resistive loss circuit.

16. A method in a phase shifter for selecting a phase shift, the method comprising:
   selecting, by a switch circuit, between a first signal path and a second signal path; wherein the first and the second signal path are coupled from an input to an output, the first and second signal path having a corresponding first and second phase shift for a signal coupled through the respective first and second signal path; wherein a first insertion loss for the first signal path and a second insertion loss for the second signal path are equalized; and
   providing a signal at the input,
   wherein the selecting by the switch circuit includes selecting, by a first integrated circuit switch disposed in series with the first signal path, between the first signal path and the second signal path and selecting by a second integrated circuit switch associated with the second signal path a resistive loss circuit configured to equalize the first insertion loss and the second insertion loss.

17. The method of claim 16 wherein the first signal path is configured for minimal phase shifting and the second signal path is configured to provide the second phase shift to a signal coupled through the second signal path.

18. The method of claim 16 wherein the second integrated circuit switch is configured to by pass the resistive loss circuit when the second signal path is selected, the second signal path including a reactive circuit and the resistive loss circuit, the reactive circuit configured to provide the second phase shift.

19. The method of claim 16 further comprising second selecting, by a second switch circuit between a third signal path and a fourth signal path wherein the third and fourth signal path are coupled from the output to another output, the third and fourth signal path having corresponding third and fourth phase shifts for a signal coupled through the respective third and fourth signal path, wherein a third insertion loss for the third signal path and a fourth insertion loss for the fourth path are equalized, and
   wherein the first and third phase shifts are minimal and the second and fourth phase shifts are predetermined phase shifts that differ each from the other.

20. A method in a phase shifter for selecting a phase shift, the method comprising:
   selecting, by a switch circuit, between a first signal path and a second signal path; wherein the first and the second signal path are coupled from an input to an output, the first and second signal path having a corresponding first and second phase shift for a signal coupled through the respective first and second signal path: wherein a first insertion loss for the first signal path and a second insertion loss for the second signal path are equalized; and
   providing a signal at the input,
   wherein the switch circuit further includes an integrated circuit switch and the selecting further comprises controlling the integrated circuit switch to by pass a resistive loss circuit when the second signal path is selected, the second signal path including a reactive circuit and the resistive loss circuit, the reactive circuit configured to provide the second phase shift.

21. The method of claim 20 wherein the reactive circuit further comprises a first reactance and a second reactance that are series coupled at a common node and a shunt circuit coupled from the common node to a reference node, the shunt circuit further comprising a third reactance in series with the resistive loss circuit where the integrated circuit switch is in parallel with the resistive loss circuit.

22. The method of claim 21 wherein the first reactance and the second reactance are each an inductive reactance including at least one of a lumped inductor and a high impedance transmission line, the third reactance is a capacitive reactance including a metal insulator metal capacitor and the integrated circuit switch is a pseudo morphic High Electron Mobility Transistor (pHEMT).

\* \* \* \* \*